(12) United States Patent
Takamine (10) Patent No.: US 7,459,997 B2
(45) Date of Patent: Dec. 2, 2008

(54) ELASTIC WAVE FILTER DEVICE AND DUPLEXER

(75) Inventor: Yuichi Takamine, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1 day.

(21) Appl. No.: 11/761,895

(22) Filed: Jun. 12, 2007

(65) Prior Publication Data

US 2007/0296522 A1    Dec. 27, 2007

(30) Foreign Application Priority Data

Jun. 21, 2006    (JP)    ............... 2006-171670

(51) Int. Cl.
*H03H 9/00*    (2006.01)
(52) U.S. Cl. ...................... 333/195; 333/193
(58) Field of Classification Search ......... 333/193–196, 333/133
See application file for complete search history.

(56) References Cited

U.S. PATENT DOCUMENTS

| | | | | |
|---|---|---|---|---|
| 5,932,950 | A * | 8/1999 | Yamada et al. | .......... 310/313 D |
| 6,693,501 | B2 | 2/2004 | Sawada et al. | |
| 6,720,842 | B2 | 4/2004 | Sawada | |
| 6,744,333 | B2 | 6/2004 | Sawada | |
| 6,809,614 | B2 * | 10/2004 | Fujii et al. | ................... 333/193 |
| 6,828,878 | B2 * | 12/2004 | Takamine et al. | ........... 333/193 |
| 6,891,451 | B2 * | 5/2005 | Sawada | ..................... 333/195 |
| 7,078,989 | B2 | 7/2006 | Inoue et al. | |
| 2001/0013815 | A1 | 8/2001 | Sawada | |
| 2002/0135442 | A1 | 9/2002 | Sawada et al. | |
| 2003/0146805 | A1 | 8/2003 | Sawada | |

FOREIGN PATENT DOCUMENTS

| | | |
|---|---|---|
| JP | 2001-308672 A | 11/2001 |
| JP | 2002-290203 A | 10/2002 |
| JP | 2004-194269 A | 7/2004 |

* cited by examiner

*Primary Examiner*—Don P Le
(74) *Attorney, Agent, or Firm*—Keating & Bennett, LLP (57) ABSTRACT

In an elastic wave acoustic device, input ends of first to third longitudinally coupled resonator surface acoustic wave filters are connected to an unbalanced signal terminal, the output end of the first longitudinally coupled resonator surface acoustic wave filter, and a first IDT defining a first output terminal of the second longitudinally coupled resonator surface acoustic wave filter are connected to a first balanced signal terminal, the output end of the third longitudinally coupled resonator surface acoustic wave filter, and a third IDT defining a second output terminal of the second longitudinally coupled resonator surface acoustic wave filter are connected to a second balanced signal terminal, and the phase of an output signal to an input signal of the first longitudinally coupled resonator surface acoustic wave filter differs by about 180 degrees from the phase of an output signal to an input signal of the third longitudinally coupled resonator surface acoustic wave filter. Thus, the elastic wave filter device has a balanced-to-unbalanced conversion function and an impedance conversion function, and reduces an insertion loss within a passband.

9 Claims, 5 Drawing Sheets

ELASTIC WAVE FILTER DEVICE AND DUPLEXER

BACKGROUND OF THE INVENTION

1. Field of the Invention

The present invention relates to an elastic wave filter device utilizing a surface acoustic wave and an elastic boundary wave, and more particularly, the present invention relates to an elastic wave filter device configured by connecting a plurality of longitudinally coupled resonator elastic wave filters, and a duplexer including such an elastic wave filter device thereof.

2. Description of the Related Art

With cell phones, there has been demand for a reduction in the number of components, to realize reduction in size. Consequently, there has been demand for one component to have multiple functions. Balanced duplexers have been developed as one example of a component including such multiple functions. Balanced duplexers include a transmission-side filter connected to an antenna terminal, and a reception-side filter having a balanced-to-unbalanced conversion function. The reception-side filter has a balanced-to-unbalanced conversion function, so it is possible to omit a component configured to realize a balanced-to-unbalanced conversion function, i.e., a balun.

One example of a surface acoustic wave filter device which is used as such a reception-side filter has been disclosed in the following Japanese Unexamined Patent Application Publication No. 2002-290203.

Figure 8:
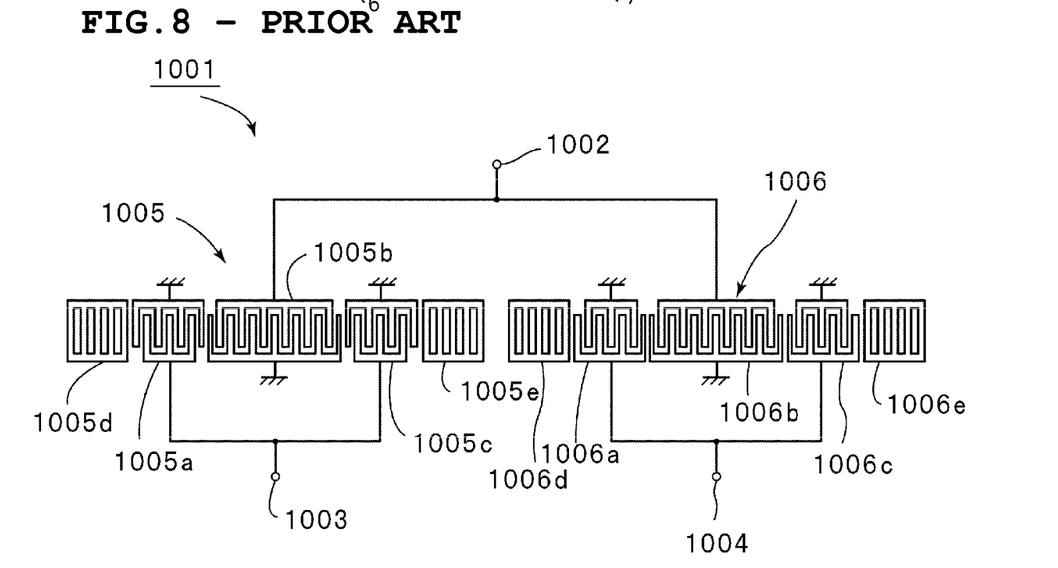
FIG. 8 is a schematic plan view illustrating the electrode configuration of an existing surface acoustic wave filter device.

FIG. 8 is a schematic plan view illustrating the electrode configuration of a surface acoustic wave filter device described in Japanese Unexamined Patent Application Publication No. 2002-290203.

A surface acoustic wave filter device 1001 is a longitudinally coupled resonator surface acoustic wave filter defining a balanced type filter. The surface acoustic wave filter device 1001 is configured by an electrode configuration shown in the drawing being formed on a piezoelectric substrate.

The surface acoustic wave filter device 1001 includes an unbalanced signal terminal 1002 defining an input terminal, and first and second balanced signal output terminals 1003 and 1004 defining output terminals. First and second longitudinally coupled resonator surface acoustic wave filters 1005 and 1006 are connected to the unbalanced signal terminal 1002. The first and second longitudinally coupled resonator surface acoustic wave filters 1005 and 1006 are longitudinally coupled resonator surface acoustic wave filters serving as 3-IDT type filters wherein the first longitudinally coupled resonator surface acoustic wave filter 1005 includes three IDTs 1005a to 1005c, and the second longitudinally coupled resonator surface acoustic wave filter 1006 includes three IDTs 1006a to 1006c. Note that reflectors 1005d and 1005e are disposed at both sides in the surface wave propagating direction of a region where the IDTs 1005a to 1005c are provided. With the longitudinally coupled resonator surface acoustic wave filter 1006 as well, reflectors 1006d and 1006e are provided in the same way.

First ends of the central IDTs 1005b and 1006b are connected to the unbalanced signal terminal 1002, and second of the IDTs 1005b and 1006b are connected to ground. First ends of the IDTs 1005a and 1005c at both sides of the longitudinally coupled resonator surface acoustic wave filter 1005 are connected to the first balanced signal terminal 1003, and second ends of the IDTs 1005a and 1005c are connected to ground. Similarly, first ends of the IDTs 1006a and 1006c at both sides of the second longitudinally coupled resonator surface acoustic wave filter 1006 are connected to the second balanced signal terminal 1004, and second ends of the IDTs 1006a and 1006c are connected to ground.

Here, the phase of an output signal to an input signal of the second longitudinally coupled resonator surface acoustic wave filter 1006 is different by about 180 degrees from the phase of an output signal to an input signal of the first longitudinally coupled resonator surface acoustic wave filter 1005, thereby realizing a balanced-to-unbalanced conversion function. The design parameters of the first longitudinally coupled resonator surface acoustic wave filter 1005 are assumed to be the same as those of the second longitudinally coupled resonator surface acoustic wave filter 1006 except for the above-mentioned phase of an output signal to an input signal.

With the surface acoustic wave filter device 1001 described in Japanese Unexamined Patent Application Publication No. 2002-290203, a balanced-to-unbalanced conversion function has been realized as described above, which enables the ratio of input-side impedance to output-side impedance to be set to about 1:2 to 1:4. For example, a balanced-type surface acoustic wave filter device is used as a reception-side filter at the RF stage of a cell phone, and an amplifier having balanced input is connected to the subsequent stage thereof. The input impedance of the amplifier connected to the subsequent stage is relatively high, so the surface acoustic wave filter device 1001 whose ratio of input-side impedance and output-side impedance is set to about 1:2 to 1:4 can be used appropriately.

Figure 9:
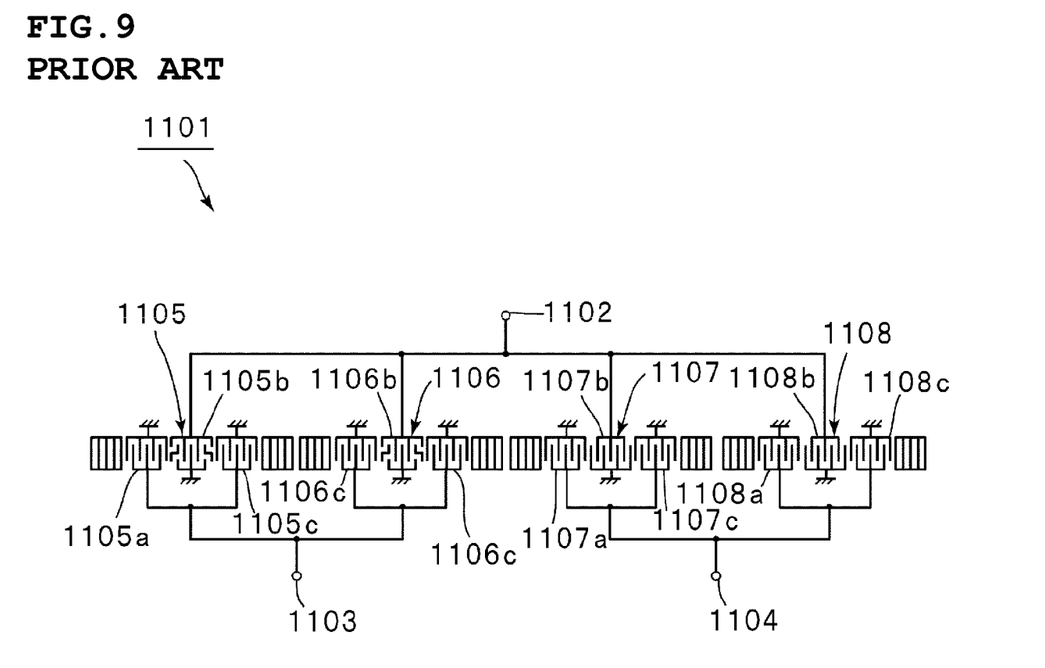
FIG. 9 is a plan view schematically illustrating the electrode configuration of another example of an existing surface acoustic wave filter device.

On the other hand, as shown in the schematic plan view in FIG. 9, a balanced-type surface acoustic wave filter device 1101 including four longitudinally coupled resonator surface acoustic wave filters has been known. The surface acoustic wave filter device 1101 includes an unbalanced signal terminal 1102, and first and second balanced signal terminals 1103 and 1104 defining output terminals. First ends of second IDTs 1105b to 1108b positioned at the centers of first to fourth longitudinally coupled resonator surface acoustic wave filters are connected to the unbalanced signal terminal 1102, and second ends of the IDTs 1105b to 1108b are connected to ground.

The first and third IDTs 1105a, 1105c, 1106a, and 1106c at both sides of the first and second longitudinally coupled resonator surface acoustic wave filters 1105 and 1106 are connected to the first balanced signal terminal 1103. On the other hand, the first and third IDTs 1107a, 1107c, 1108a, and 1108c positioned at both sides of the central second IDTs 1107b and 1108b of the third and fourth longitudinally coupled resonator surface acoustic wave filters 1107 and 1108 are connected to the second balanced signal terminal 1104 as shown in the drawing.

Here, the phase of an output signal to an input signal of the third and fourth longitudinally coupled resonator surface acoustic wave filters 1107 and 1108 is different by about 180 degrees from the phase of an output signal to an input signal of the first and second longitudinally coupled resonator surface acoustic wave filters 1105 and 1106, and thus balanced output is taken out from the first and second balanced signal terminals 1103 and 1104.

However, with the surface acoustic wave filter device 1001 described in Japanese Unexamined Patent Application Publication No. 2002-290203, the crossing width of IDT electrodes is relatively long. Consequently, such as the case of the reception-side filter of cell-phone equipment for DCS or PCS, upon the surface acoustic wave filter being used as a band pass filter whose passband is about 2 GHz, the resistance of IDT electrode becomes high, i.e., ohmic loss increases, and consequently there is no choice other than increasing the insertion loss.

On the other hand, the surface acoustic wave filter device 1101 shown in FIG. 9 is a balanced-type surface acoustic wave filter device made up of four filter units and one stage, the crossing width of IDT electrodes can be reduced to about ½ as compared with the balanced-type surface acoustic wave filter device 1001 made up of two filter units and one stage. Accordingly, ohmic loss due to an IDT electrode can be reduced. However, the excitation of a bulk wave (SSBW) increases, ripple is readily generated within a passband, thus resulting in a problem wherein insertion loss increases.

Note that in recent years, instead of a surface acoustic wave filter device, an elastic boundary wave filter utilizing an elastic boundary wave has been disclosed wherein the simplification of a package configuration can be realized. With such an elastic boundary wave filter as well, as with the case of a surface acoustic wave filter, a configuration including a balanced-to-unbalanced conversion function, and also enabling the amount of out-of-band attenuation to be increased, has been strongly demanded.

SUMMARY OF THE INVENTION

In order to overcome the problems described above, preferred embodiments of the present invention provide an elastic wave filter device including a balanced-to-unbalanced conversion function, enables obtaining of balanced output with high output impedance as compared with input-side impedance, and further reduces influences due to a bulk wave without increasing ohmic loss due to an IDT electrode while enabling the reduction of insertion loss in a passband, and also provide a duplexer including such an elastic wave filter device.

According to a first preferred embodiment of the present invention, an elastic wave filter device includes a piezoelectric substrate, first to third longitudinally coupled resonator elastic wave filters including first to third IDTs disposed in the elastic wave propagating direction on the piezoelectric substrate, and reflectors disposed at both sides in the elastic wave propagating direction of a region where the first to third IDTs are provided, an unbalanced signal terminal to which each second IDT of the first to third longitudinally coupled resonator elastic wave filters is connected, and first and second balanced signal terminals defining output terminals, wherein the phase of an output signal to an input signal of the first longitudinally coupled resonator elastic wave filter differs by about 180 degrees from the phase of an output signal to an input signal of the third longitudinally coupled resonator elastic wave filter, the second longitudinally coupled resonator elastic wave filter includes first and second output terminals, the phase of a signal to be transmitted to the first output terminal from an input terminal of the second longitudinally coupled resonator elastic wave filter differs by about 180 degrees from the phase of a signal to be transmitted to the second output terminal from the input terminal of the second longitudinally coupled resonator elastic wave filter; the phase of the output signal corresponding to the input signal of the first longitudinally coupled resonator elastic wave filter is the same phase as the phase of the signal transmitted to the first output terminal from the input terminal of the second longitudinally coupled resonator elastic wave filter; the phase of the output signal corresponding to the input signal of the third longitudinally coupled resonator elastic wave filter is the same phase as the phase of the signal transmitted to the second output terminal from the input terminal of the second longitudinally coupled resonator elastic wave filter; one of the first and third IDTs of the second longitudinally coupled resonator elastic wave filter is connected to the first output terminal, and the other is connected to the second output terminal; the first and third IDTs of the first longitudinally coupled resonator elastic wave filter, and the first output terminal of the second longitudinally coupled resonator elastic wave filter are connected to the first balanced signal terminal, and the first and third IDTs of the third longitudinally coupled resonator elastic wave filter, and the second output terminal of the second longitudinally coupled resonator elastic wave filter are connected to the second balanced signal terminal.

According to a second preferred embodiment of the present invention, an elastic wave filter device includes a piezoelectric substrate, first to third longitudinally coupled resonator elastic wave filters including first to third IDTs disposed in order in the elastic wave propagating direction on the piezoelectric substrate, and reflectors disposed at both sides in the elastic wave propagating direction of a region where the first to third IDTs are provided, an unbalanced signal terminal to which the respective first and third IDTs of the first to third longitudinally coupled resonator elastic wave filters are connected, and first and second balanced signal terminals defining output terminals, wherein the phase of an output signal to an input signal of the first longitudinally coupled resonator elastic wave filter differs by about 180 degrees from the phase of an output signal to an input signal of the third longitudinally coupled resonator elastic wave filter, the second longitudinally coupled resonator elastic wave filter includes first and second output terminals, the phase of a signal to be transmitted to the first output terminal from an input end of the second longitudinally coupled resonator elastic wave filter differs by about 180 degrees from the phase of a signal to be transmitted to the second output terminal from the input end of the second longitudinally coupled resonator elastic wave filter, the phase of the output signal corresponding to the input signal of the first longitudinally coupled resonator elastic wave filter is the same phase as the phase of the signal transmitted to the first output terminal from the input end of the second longitudinally coupled resonator elastic wave filter, the phase of the output signal corresponding to the input signal of the third longitudinally coupled resonator elastic wave filter is the same phase as the phase of the signal transmitted to the second output terminal from the input end of the second longitudinally coupled resonator elastic wave filter, the second IDT of the second longitudinally coupled resonator elastic wave filter includes a first sub-IDT portion and a second sub-IDT portion which are provided by being divided in the elastic wave propagating direction, and the first sub-IDT portion and the second sub-IDT portion is each connected to the first and second output terminals, the second IDT of the first longitudinally coupled resonator elastic wave filter, and the first sub-IDT portion of the second longitudinally coupled resonator elastic wave filter are connected to the first balanced signal terminal, and the second IDT of the third longitudinally coupled resonator elastic wave filter, and the second sub-IDT portion of the second longitudinally coupled resonator elastic wave filter are connected to the second balanced signal terminal.

According to a third preferred embodiment of the present invention, an elastic wave filter device includes a piezoelectric substrate, first to sixth longitudinally coupled resonator elastic wave filters including first to third IDTs disposed in order in the elastic wave propagating direction on the piezoelectric substrate, and reflectors disposed at both sides in the elastic wave propagating direction of a region where the first to third IDTs are provided, an unbalanced signal terminal to which each second IDT of the first to third longitudinally coupled resonator elastic wave filters is connected, and first and second balanced signal terminals defining output terminals, wherein the first and third IDTs of the first longitudinally coupled resonator elastic wave filter are connected to the first and third IDTs of the fourth longitudinally coupled resonator elastic wave filter by first and second signal lines, respectively, the first and third IDTs of the second longitudinally coupled resonator elastic wave filter are connected to the first and third IDTs of the fifth longitudinally coupled resonator elastic wave filter by third and fourth signal lines, respectively, the first and third IDTs of the third longitudinally coupled resonator elastic wave filter are connected to the first and third IDTs of the sixth longitudinally coupled resonator elastic wave filter by fifth and sixth signal lines, respectively, signals which pass to the first, third, and fifth signal lines have the same phase, signals which pass to the second, fourth, and sixth signal lines have the same phase, the phase of the signals which pass to the first, third, and fifth signal lines differs by about 180 degrees from the phase of the signals which pass to the second, fourth, and sixth signal lines, the second IDT of the fifth longitudinally coupled resonator elastic wave filter includes a first sub-IDT portion and a second sub-IDT portion which are provided by being divided in the elastic wave propagating direction, the second IDT of the fourth longitudinally coupled resonator elastic wave filter, and the first sub-IDT portion of the fifth longitudinally coupled resonator elastic wave filter are connected to the first balanced signal terminal, and the second IDT of the sixth longitudinally coupled resonator elastic wave filter, and the second sub-IDT portion of the fifth longitudinally coupled resonator elastic wave filter are connected to the second balanced signal terminal, whereby the respective first to third IDTs of the first to sixth longitudinally coupled resonator elastic wave filters are configured such that balanced output can be taken out from the first and second balanced signal terminals.

With the first to third preferred embodiments of the present invention, at least the two longitudinally coupled resonator elastic wave filters are preferably arranged such that the elastic wave propagating path of each filter is positioned on generally the same straight line, and adjacent reflectors are shared with one reflector at least at one location of locations where longitudinally coupled resonator elastic wave filters are adjacent to each other in the elastic wave propagating direction. In this case, the number of reflectors can be reduced, and also a reduction in the size of the elastic wave filter device can be realized.

A duplexer according to the preferred embodiments of the present invention includes a transmission-side filter, and a reception-side filter including an elastic wave filter device configured in accordance with the above-described preferred embodiments of the present invention, which enables reduction in ohmic loss of an IDT electrode and influences of a bulk wave, of the reception-side filter to be realized, and consequently enables reduction in insertion loss of a passband to be realized effectively.

With the elastic wave filter device according to the first preferred embodiment of the present invention, each second IDT of the first to third longitudinally coupled resonator elastic wave filters is connected to the unbalanced signal terminal, the second longitudinally coupled resonator elastic wave filter includes the first and second output terminals, the first and third IDTs of the first longitudinally coupled resonator elastic wave filter, and the first output terminal of the second longitudinally coupled resonator elastic wave filter are connected to the first balanced signal terminal, and the first and third IDTs of the third longitudinally coupled resonator elastic wave filter, and the second output terminal of the second longitudinally coupled resonator elastic wave filter are connected to the second balanced signal terminal, so ohmic loss of an IDT electrode, and influences of a bulk wave can be reduced, and accordingly, reduction in insertion loss can be realized.

Similarly, with the second preferred embodiment of the present invention, the respective first and third IDTs of the first to third longitudinally coupled resonator elastic wave filters are connected to the unbalanced signal terminal, the second IDT of the second longitudinally coupled resonator elastic wave filter includes the first and second sub-IDT portions, the second IDT of the first longitudinally coupled resonator elastic wave filter, and the first sub-IDT portion of the second longitudinally coupled resonator elastic wave filter are connected to the first balanced signal terminal, and the second IDT of the third longitudinally coupled resonator elastic wave filter, and the second sub-IDT portion of the second longitudinally coupled resonator elastic wave filter are connected to the second balanced signal terminal, so ohmic loss of an IDT electrode, and influences of a bulk wave can be reduced, and accordingly, reduction in insertion loss can be realized.

With the elastic wave filter device according to the third preferred embodiment of the present invention, the fourth to sixth longitudinally coupled resonator elastic wave filters are connected to the subsequent stages of the first to third longitudinally coupled resonator elastic wave filters, the second IDT of the fifth longitudinally coupled resonator elastic wave filter includes the first and second sub-IDT portions, the second IDT of the fourth longitudinally coupled resonator elastic wave filter, and the first sub-IDT portion of the fifth longitudinally coupled resonator elastic wave filter are connected to the first balanced signal terminal, and the second IDT of the sixth longitudinally coupled resonator elastic wave filter, and the second sub-IDT portion of the fifth longitudinally coupled resonator elastic wave filter are connected to the second balanced signal terminal, so that ohmic loss of an IDT electrode and influences of a bulk wave can be reduced, and accordingly, reduction in insertion loss can be realized.

Thus, according to the first to third preferred embodiments of the present invention, with the elastic wave filter device including a balanced-to-unbalanced conversion function arranged to increase output impedance as compared with input impedance, ohmic loss of an IDT electrode and influences of a bulk wave can be reduced, and accordingly, reduction in insertion loss can be realized.

Other features, elements, characteristics and advantages of the present invention will become more apparent from the following detailed description of preferred embodiments of the present invention with reference to the attached drawings.

DETAILED DESCRIPTION OF PREFERRED EMBODIMENTS

Specific preferred embodiments of the present invention will be described below with reference to the drawings, whereby the present invention will become more apparent.

First Preferred Embodiment

Figure 1:
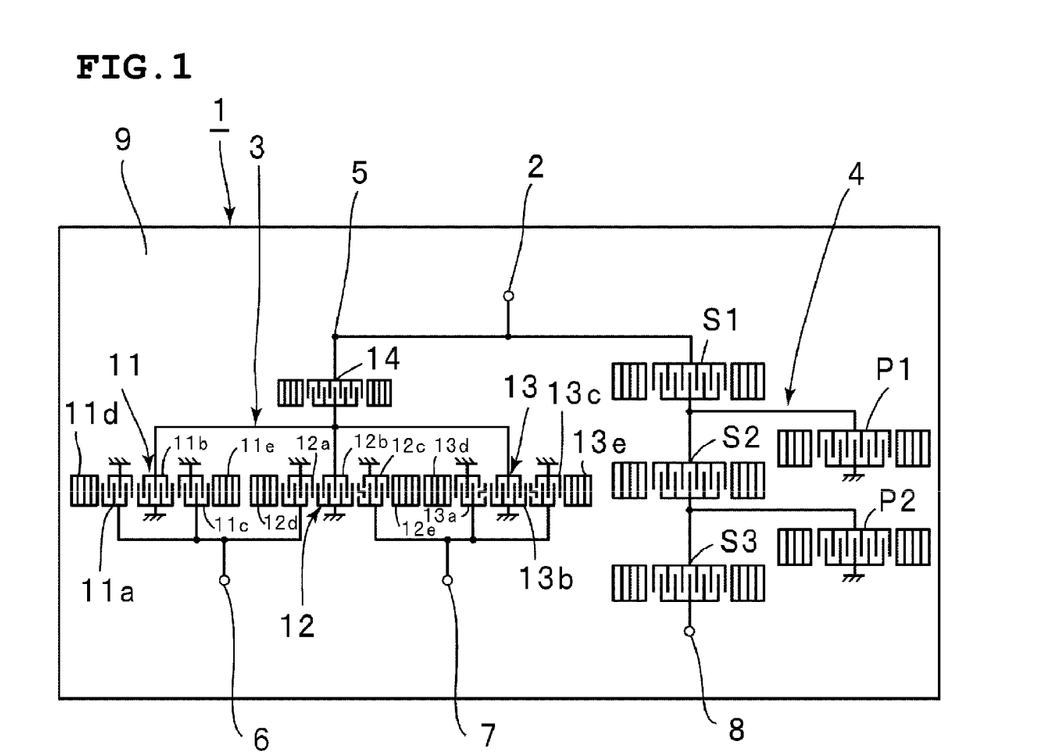
FIG. 1 is a schematic plan view illustrating a duplexer according to a first preferred embodiment of the present invention.

FIG. 1 is a plan view schematically illustrating the electrode configuration of a duplexer according to a first preferred embodiment of the present invention. A duplexer 1 includes an antenna terminal 2. A reception-side filter preferably including a surface acoustic wave filter device 3 defining one preferred embodiment of the present invention, and a surface acoustic wave filter device 4 having a ladder circuit configuration making up a transmission-side filter, are connected to the antenna terminal 2.

The surface acoustic wave filter device 3 includes an unbalanced signal terminal 5 connected to the antenna terminal 2, and first and second balanced terminals 6 and 7 defining reception output terminals. On the other hand, with the surface acoustic wave filter device 4, one end is connected to the antenna terminal 2, and the other end is connected to a transmission terminal 8.

With the duplexer 1 according to a preferred embodiment of the present embodiment, the reception-side filter includes the surface acoustic wave filter device 3 which is a balanced type, and also a longitudinally coupled resonator, and accordingly the duplexer 1 is a balanced duplexer. Also, the duplexer 1 according to the present preferred embodiment is preferably used for a cell phone using the WCDMA method, the transmission frequency band of the WCDMA is 1920 to 1980 MHz, and the reception frequency band is 2110 to 2170 MHz. Accordingly, a passband of the surface acoustic wave filter device 3 defining the reception-side filter is 2110 to 2170 MHz, so there is strong demand for increase in the amount of attenuation of 1920 to 1980 MHz, as a reception-side passband.

The duplexer 1 is configured by the electrode configuration shown in the drawing being formed on a piezoelectric substrate 9. The piezoelectric substrate 9 is preferably a LiTaO$_3$ substrate of 40±5° rotation Y plate and X propagation. The insertion loss of the longitudinally coupled resonator surface acoustic wave filter device 3 defining a reception-side filter can be further reduced by using the LiTaO$_3$ substrate of this crystal angle, which is desirable.

Note that the transmission-side filter and the reception-side filter do not always need to be formed on the same piezoelectric substrate, and so may be formed on different piezoelectric substrates. Accordingly, a piezoelectric substrate included in the surface acoustic wave filter device 4 may be made of a piezoelectric substrate material suitable for the transmission-side filter, which differs from the above-mentioned piezoelectric substrate.

Also, the piezoelectric substrate 9 included in the longitudinally coupled resonator surface acoustic wave filter device 3 is not restricted to a LiTaO$_3$ substrate of 40±5° rotation Y plate and X propagation; but rather may be a LiTaO$_3$ substrate of another crystal angle, or piezoelectric single crystal or piezoelectric ceramics, and accordingly, is not restricted to any particular substrate.

The longitudinally coupled resonator surface acoustic wave filter device 3 defining the above-mentioned reception-side filter includes first to third longitudinally coupled resonator surface acoustic wave filters 11 to 13 serving as 3-IDT type filters. The input ends of the first to third longitudinally coupled resonator surface acoustic wave filters 11 to 13 are commonly connected, and are connected to an unbalanced signal terminal 5 via a one-port surface acoustic wave resonator 14.

The reason why the one-port surface acoustic wave resonator 14 is connected to the input sides of the first to third longitudinally coupled resonator surface acoustic wave filters 11 to 13 is to realize the phase matching between the surface acoustic wave filter device 4 defining a transmission-side filter and the above-mentioned surface acoustic wave filter device 3. In other words, in order to make common the characteristics of the terminals of the transmission-side filter and the reception-side filter at a common connection point, it is ideal that the impedance of one filter at the passband of the other filter be infinity. The one-port surface acoustic wave resonator 14 is serially connected to the first to third longitudinally coupled resonator surface acoustic wave filters 11 to 13, whereby the transmission frequency band of the reception-side filter is shifted at a high impedance side. Accordingly, selecting the capacity of the one-port surface acoustic wave resonator 14 enables the above-mentioned phase matching to be realized without having to use a separate device for phase matching. Thus, reduction in size can be realized, and also a component mounting area of a cell phone can be reduced.

Each of the first to third longitudinally coupled resonator surface acoustic wave filters 11 to 13 includes first to third IDTs 11a, 11b, 11c to 13a, 13b, and 13c, which are disposed in the surface acoustic wave propagating direction.

With the first longitudinally coupled resonator surface acoustic wave filter 11, reflectors 11d and 11e are provided at both sides in the surface wave propagating direction of a region where the first to third IDTs 11a to 11c are provided. The other longitudinally coupled resonator surface acoustic wave filters 12 and 13 also include reflectors 12d, 12e, 13d, and 13e.

First ends of the second IDTs 11b, 12b, and 13b positioned at the centers of the first to third longitudinally coupled resonator surface acoustic wave filters 11 to 13 are connected to the unbalanced signal terminal 5 via the one-port surface acoustic wave resonator 14, and second ends thereof are connected to ground.

With the second longitudinally coupled resonator surface acoustic wave filter 12, a first end of the first IDT 12a defines a first output terminal, and a second end of the third IDT 12c defines a second output terminal. Note that the IDT 12a may define the second output terminal, and the third IDT 12c define the first output terminal.

First ends of the first and third IDTs 11a and 11c of the first longitudinally coupled resonator surface acoustic wave filter 11 are commonly connected to one end of the first IDT 12a of the second longitudinally coupled resonator surface acoustic wave filter 12, and are connected to the first balanced signal terminal 6. Second ends of the IDTs 11a, 11c, and the IDT 12a are connected to ground.

On the other hand, a first end of the third IDT 12c of the second longitudinally coupled resonator surface acoustic wave filter 12 is commonly connected to first ends of the first and third IDTs 13a and 13c of the third longitudinally coupled resonator surface acoustic wave filter 13, and are connected to the second balanced signal terminal 7. Second ends of the IDTs 12c, and the IDTs 13a and 13c are connected to ground.

The phase of an output signal to an input signal of the first longitudinally coupled resonator surface acoustic wave filter 11 is assumed to be the same as the phase of a signal to be transmitted to one end of the IDT 12a, defining a first output terminal, from an input signal of the second longitudinally coupled resonator surface acoustic wave filter 12. Also, the phase of an output signal to an input signal of the third longitudinally coupled resonator surface acoustic wave filter 13 is assumed to be the same as the phase of a signal to be transmitted to one end of the IDT 12c, defining a second output terminal, from an input signal of the second longitudinally coupled resonator surface acoustic wave filter 12.

Also, the phase of an output signal to an input signal of the first longitudinally coupled resonator surface acoustic wave filter 11 differs by about 180 degrees from the phase of an output signal to an input signal of the third longitudinally coupled resonator surface acoustic wave filter 13. Similarly, the phase of a signal to be transmitted to the output end of the IDT 12a, defining the above-mentioned first output terminal, from the input end of the second longitudinally coupled resonator surface acoustic wave filter 12 differs by about 180 degrees from the phase of a signal to be transmitted to the output end of the IDT 12c, defining the above-mentioned second output terminal, from the input end of the second longitudinally coupled resonator surface acoustic wave filter 12.

That is to say, the IDTs 11a, 11b, 11c to 13a, 13b, and 13c are configured to realize the signal phase relationships such as shown above. More specifically, with the present preferred embodiment, the polarities of the IDTs 11a, 11c, and 12a are inverted relative to the IDTs 12c, 13a, and 13c, thereby realizing the above-mentioned phase relationships. The configurations of the IDTs 11a to 13c are not restricted to those shown in the drawing as long as the above-mentioned phase relations are realized.

Accordingly, let us say that with the surface acoustic wave filter device 3, balanced output can be obtained from the first and second balanced signal terminals 6 and 7. Also, let us say that with the surface acoustic wave filter device 3, the ratio between input-side impedance and output-side impedance can be set to about 1:2 to 1:4. Note that with the present preferred embodiment, the IDT 12b side end portion of the IDT 12c, and the IDT 13b side end portion of the IDTs 13a and 13c are weighted by a method of series weighting to improve signal balancing between a pair of the balanced signal terminals 6 and 7. Series weighting is applied by providing a floating electrode finger such as shown in the drawing, of multiple electrode fingers including an electrode finger positioned at the end portion of an IDT, and one or more electrode fingers continuous with that electrode finger.

Note that with the transmission-side filter 4, multiple series arm resonators S1 to S3 shown in the drawing are connected to parallel arm resonators P1 and P2 so as to define a ladder circuit. The series arm resonators S1 to S3, and the parallel arm resonators P1 and P2 are each configured as a one-port surface acoustic wave resonator.

With the duplexer 1 according to the present preferred embodiment, with the surface acoustic wave filter device 3 defining the above-mentioned reception-side filter, insertion loss within a passband can be reduced effectively. This will be described based on more a specific experimental example.

Now let us say that the surface acoustic wave filter device 3 has been designed such that the input side of the surface acoustic wave filter device 3 defining a reception-side filter, i.e., impedance of the unbalanced signal terminal 5 side is about 50 ohms, and impedance of the first and second balanced signal terminals 6 and 7 defining reception output terminals is about 100 ohms. First, the first longitudinally coupled resonator surface acoustic wave filter 11 has been designed such as shown in the following.

Let us say that the wave length determined with the pitch of electrode fingers of an IDT is $\lambda I$.
  Crossing width of electrode fingers of IDT: 28.8 $\lambda I$
  Number of electrode fingers of IDTs 11a and 11c: 29
  Number of electrode fingers of IDT 11b: 53
  Number of electrode fingers of reflectors 11d and 11e: 65
  Metallization ratio: 0.67
  Electrode film thickness: 0.106 $\lambda I$ Let us say that the second longitudinally coupled resonator surface acoustic wave filter 12 is the same as the first longitudinally coupled resonator surface acoustic wave filter 11 except that the polarities of the IDT 12c is inverted relative to the IDT 11c of the first longitudinally coupled resonator surface acoustic wave filter 11, and also is weighted by a method of series weighting.

Let us say that the third longitudinally coupled resonator surface acoustic wave filter 13 is the same as the first longitudinally coupled resonator surface acoustic wave filter 11 except that the polarities of the first and third IDTs 13a and 13c are inverted relative to the first and third IDTs 11a and 11c of the first longitudinally coupled resonator surface acoustic wave filter 11, and also is weighted by a method of series weighting.

With regard to the one-port surface acoustic wave resonator 14, when assuming that the wavelength determined with the pitch of electrode fingers of an IDT is $\lambda I$:
  Crossing width of electrode fingers of IDT: 14.6 $\lambda I$
  Number of electrode fingers of IDT: 241
  Number of electrode fingers of reflector: 15
  Metallization ratio: 0.58
  Electrode film thickness: 0.109 $\lambda I$ Note that only the one surface acoustic wave resonator 14 is illustrated in FIG. 1, but with the present experimental example, the above-mentioned three surface acoustic wave resonators have been serially connected.

Figure 2:
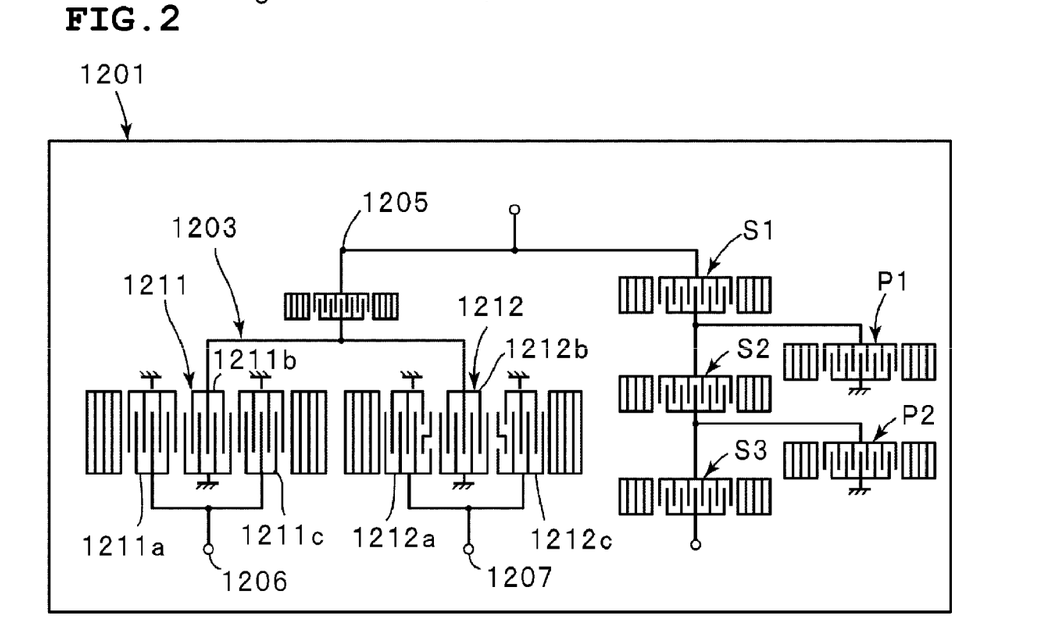
FIG. 2 is a schematic plan view illustrating a first comparative example.
Figure 3:
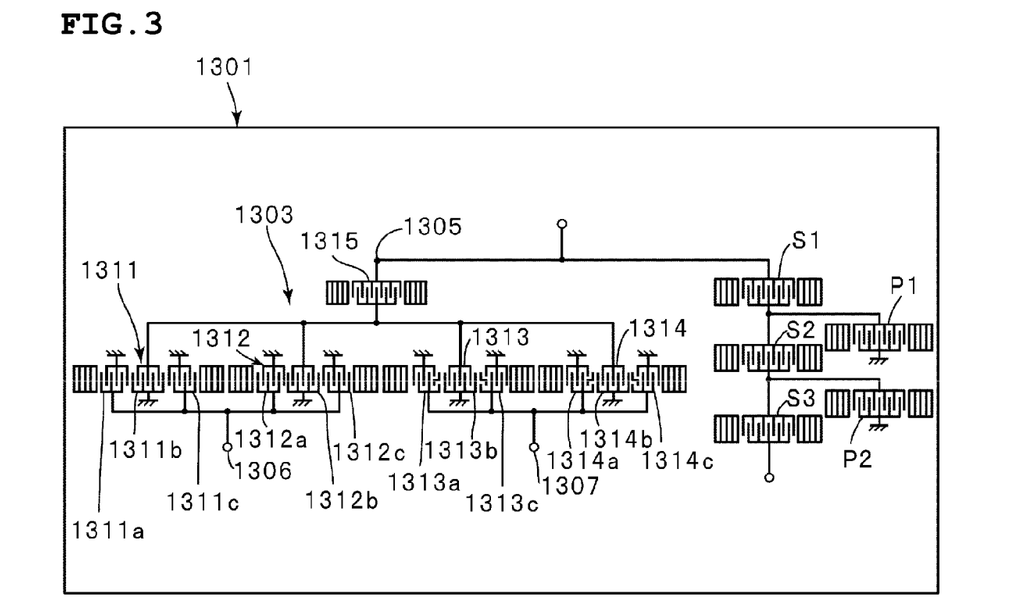
FIG. 3 is a schematic plan view illustrating a second comparative example.

For comparison, we prepared a duplexer according to a first comparative example shown in FIG. 2, and a duplexer according to a second comparative example shown in FIG. 3.

With a duplexer 1201 according to the first comparative example, with a surface acoustic wave filter device 1203 defining a reception side as with the surface acoustic wave filter device 1001 described in Japanese Unexamined Patent Application Publication No. 2002-290203, second IDTs 1211b and 1212b of the centers of first and second longitudinally coupled resonator surface acoustic wave filters 1211 and 1212 serving as 3-IDT type filters are commonly connected, and are connected to an unbalanced signal terminal 1205. Also, first and third IDTs 1211a and 1211c are commonly connected, and are connected to a first balanced signal terminal 1206. Also, first ends of first and third IDTs 1212a and 1212c are commonly connected, and are connected to a second balanced signal terminal 1207. The design parameters of the first and second longitudinally coupled resonator surface acoustic wave filters 1211 and 1212 are all the same as those of the first to third longitudinally coupled resonator surface acoustic wave filters 11 to 13 according to the above-mentioned preferred embodiment, except that the crossing width of electrode fingers is 38.4 λI.

With a duplexer 1301 according to the second comparative example shown in FIG. 3, with a longitudinally coupled resonator surface acoustic wave filter 1303 defining a reception-side filter, as with an existing example shown in FIG. 9, first ends of second IDTs 1311b to 1314b of first to fourth longitudinally coupled resonator surface acoustic wave filters 1311 to 1314 are connected to an unbalanced signal terminal 1305 via a one-port surface acoustic wave resonator 1315. As with the existing example shown in FIG. 9, first ends of first and third IDTs 1311a, 1311c, 1312a, and 1312c of the first and second longitudinally coupled resonator surface acoustic wave filters 1311 and 1312 are commonly connected, and are connected to a first balanced signal terminal 1306. Also, first ends of first and third IDTs 1313a, 1313c, 1314a, and 1314c of the third and fourth longitudinally coupled resonator surface acoustic wave filters 1313 and 1314 are commonly connected, and are connected to a second balanced signal terminal 1307. In this case, we have designed the first to fourth longitudinally coupled resonator surface acoustic wave filters 1311 to 1314 as with the first to third longitudinally coupled resonator surface acoustic wave filters 11 to 13 according to the above-mentioned preferred embodiment except that the crossing width of electrode fingers is 19.2 λI.

Figure 4:
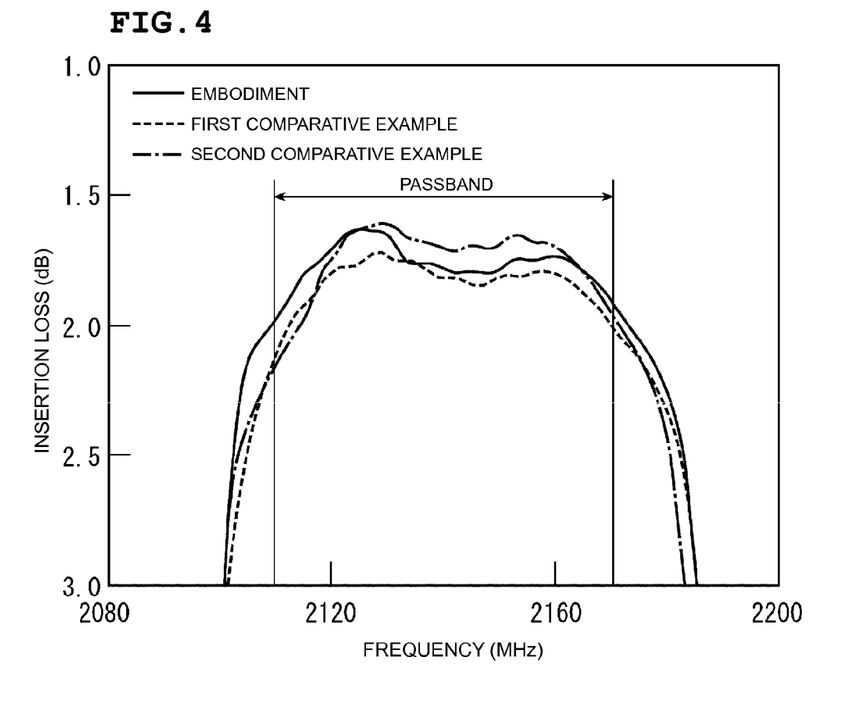
FIG. 4 is a diagram illustrating the transmission properties of reception-side filters of duplexers according to the first preferred embodiment of the present invention, first comparative example, and second comparative example.

The transmission properties of the reception-side filter of each of duplexers according to the above-mentioned preferred embodiment, and first and second comparative examples are shown in FIG. 4. As can be apparent from FIG. 4, with the above-mentioned preferred embodiment, insertion loss is reduced by about 0.15 dB in the whole region of a passband, as compared with the transmission properties of the first comparative example. This can be conceived that according to the above-mentioned preferred embodiment, the resistance of the IDT electrodes decreases as compared with the case of the first comparative example, and consequently ohmic loss decreases.

On the other hand, in the case of the second comparative example, ohmic loss becomes further less than the above-mentioned preferred embodiment, so with near a passband center, the insertion loss of the second comparative example is lower as compared with the case of the above-mentioned preferred embodiment. However, at the end portion of a passband, and particularly at the low-end portion of the passband, inversely, with the second comparative example, it can be understood that the insertion loss is higher as compared with the above-mentioned preferred embodiment. This can be conceived that with the second comparative example, the crossing width of electrode fingers is shorter than the case of the above-mentioned embodiment, so the ripple of a bulk wave (SSBW) occurs, and the properties at the low-end portion of a passband are deteriorated with the influence thereof.

Accordingly, as can be apparent from FIG. 4, it can be understood that according to the above-mentioned preferred embodiment, the insertion loss within a passband can be reduced without leading to increase in ohmic loss due to the resistance of an IDT electrode.

Thus, it can be understood that the above-mentioned preferred embodiment can provide a surface acoustic wave filter device including a balanced-to-unbalanced conversion function, and also enabling the proportion between the impedance of the unbalanced signal terminal side and the impedance of the balanced signal terminal side to be set to about 1:2 to 1:4, and further enabling the insertion loss within a passband to be reduced. Thus, with the duplexer 1 according to the above-mentioned preferred embodiment, the reception-side filter includes such a surface acoustic wave filter device 3, whereby reception properties can be improved effectively.

Note that with the above-mentioned preferred embodiment, the balanced-type duplexer 1 has been configured by the transmission-side filter made up of the surface acoustic wave filter device 4 having a ladder circuit configuration, and the above-mentioned surface acoustic wave filter device 3 being combined, but the surface acoustic wave filter device 3 according to the above-mentioned preferred embodiment itself may be used as a inter-stage filter. Even in such a case, there may be provided a band pass filter which is an inter-stage filter including a balanced-to-unbalanced conversion function, and also including an impedance conversion function, and further excels in filter properties with a low insertion loss within a passband.

Figure 5:
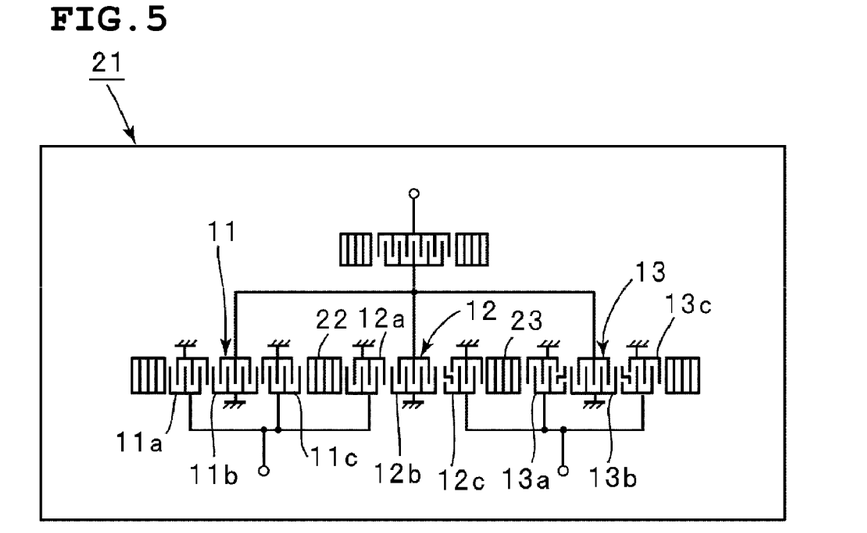
FIG. 5 is a schematic plan view illustrating the electrode configuration of a surface acoustic wave filter device according to a modification of the first preferred embodiment of the present invention.

FIG. 5 is a schematic plan view illustrating a modification of the surface acoustic wave filter device 3 used for the above-mentioned preferred embodiment. A surface acoustic wave filter device 21 according to the present modification is configured as with the surface acoustic wave filter device 3 according to the present preferred embodiment except that a reflector is shared between adjacent surface acoustic wave filters 11 and 12, and between adjacent surface acoustic wave filters 12 and 13. Accordingly, the same reference numerals are appended to the same components, thereby omitting description thereof.

As shown in FIG. 5, the first longitudinally coupled resonator surface acoustic wave filter 11 and the second longitudinally coupled resonator surface acoustic wave filter 12 are arranged such that the surface acoustic wave propagating direction is positioned along the same straight line. A reflector positioned outside the IDT 11c of the first longitudinally coupled resonator surface acoustic wave filter 11, and a reflector positioned outside the first IDT 12a of the second longitudinally coupled resonator surface acoustic wave filter 12 are shared with one reflector 22. In other words, the reflector 11e and reflector 12d shown in FIG. 1 are shared with the reflector 22.

Similarly, the surface wave propagating direction of the second longitudinally coupled resonator surface acoustic wave filter 12, and the surface wave propagating direction of the third longitudinally coupled resonator surface acoustic wave filter 13 are disposed along the same straight line, and the reflector 12e shown in FIG. 1 of the second longitudinally coupled resonator surface acoustic wave filter 12, and the reflector 13d of the third longitudinally coupled resonator surface acoustic wave filter 13 are shared with a reflector 23.

Accordingly, the adjacent two reflectors of the adjacent longitudinally coupled resonator surface acoustic wave filters are shared with one reflector, thereby enabling reduction in size of elements to be realized. Note that with preferred embodiments of the present invention, the configuration wherein a reflector is shared between adjacent elastic wave filters does not need to be realized between all adjacent elastic wave filters. That is to say, in the event that there are provided multiple adjacent portions between elastic wave filters, it is sufficient that a reflector is shared with at least one location, whereby reduction in size of elements can be realized.

Second Preferred Embodiment

Figure 6:
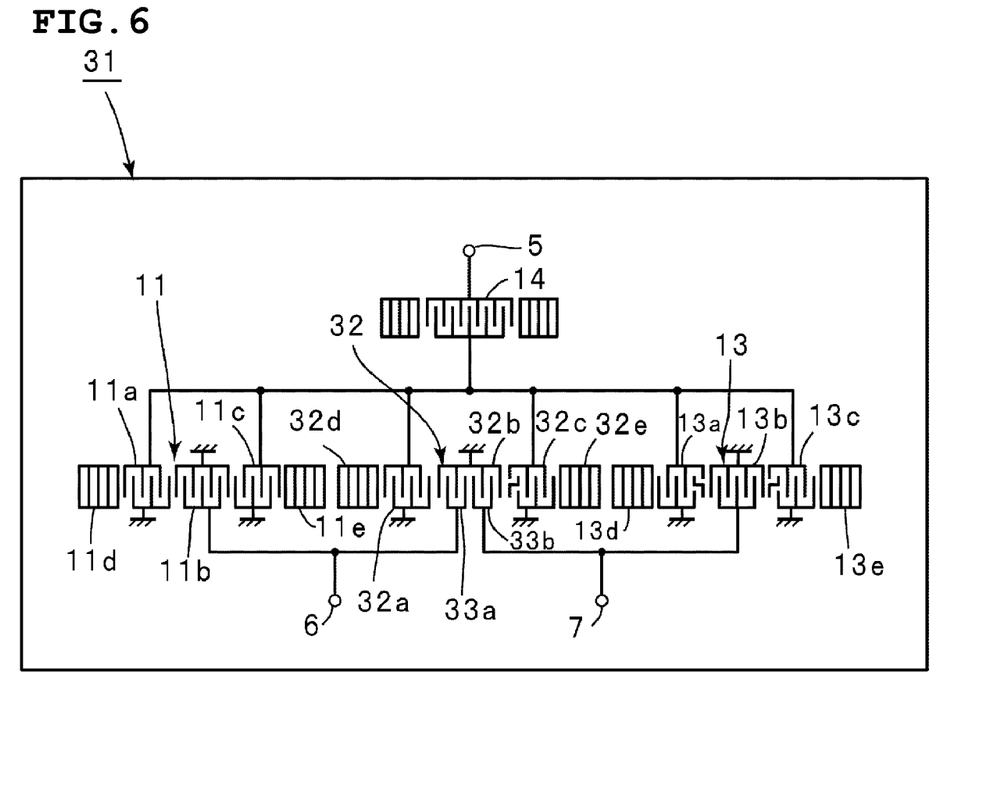
FIG. 6 is a schematic plan view illustrating a surface acoustic wave filter device according to a second preferred embodiment of the present invention.

FIG. 6 is a schematic plan view illustrating a surface acoustic wave filter device 31 according to a second preferred embodiment of the present invention. The surface acoustic wave filter device 31 according to the second preferred embodiment generally has the same configuration as the surface acoustic wave filter device 3 according to the first preferred embodiment except that a second longitudinally coupled resonator surface acoustic wave filter 32 differs from the second longitudinally coupled resonator surface acoustic wave filter 12 according to the first preferred embodiment. That is to say, the same reference numerals denote the same components as the case of the first preferred embodiment, thereby citing the description according to the first preferred embodiment, so description thereof will be omitted.

With the second longitudinally coupled resonator surface acoustic wave filter 32, first to third IDTs 32a to 32c are arranged in the surface wave propagating direction, and reflectors 32d and 32e are disposed at both sides in the surface wave propagating direction of a region where the IDTs 32a to 32c are disposed. Here, the second IDT 32b is divided into two portions in the surface wave propagating direction, whereby a first sub-IDT portion 33a and a second sub-IDT portion 33b are provided. With the present preferred embodiment, one end of the second IDT 32b is connected to ground, and the other end is referenced to as the first and second sub-IDT portions 33a and 33b as shown above.

With the present preferred embodiment, first ends of the first and third IDTs 11a, 11c, 32a, 32c, 13a, and 13c of the first to third longitudinally coupled resonator surface acoustic wave filters 11, 32, and 13 are connected to the first unbalanced signal terminal 5, and second ends are connected to ground. A first end of the second IDT 11b of the center of the first longitudinally coupled resonator surface acoustic wave filter 11, and a second end of the first sub-IDT portion 33a defining a first output terminal of the second longitudinally coupled resonator surface acoustic wave filter 32 are connected to the first balanced signal terminal 6. Also, a first end of the second sub-IDT portion 33b defining a second output terminal of the second longitudinally coupled resonator surface acoustic wave filter 32, and a second end of the second IDT 13b of the third longitudinally coupled resonator surface acoustic wave filter 13 are connected to the second balanced signal terminal 7. The second end of the IDT 11b, the second end of the IDT 32b, and the second end of the IDT 13b are connected to ground.

The phase of an output signal to an input signal of the first longitudinally coupled resonator surface acoustic wave filter 11 differs by about 180 degrees from the phase of an output signal to an input signal of the third longitudinally coupled resonator surface acoustic wave filter 13. Also, with the second longitudinally coupled resonator surface acoustic wave filter 32, the phase of a signal flowing toward the output side of the first sub-IDT portion 33a defining the first output terminal from the input end differs by about 180 degrees from the phase of a signal flowing toward the second sub-IDT portion 33b defining the second output terminal from the input end. The phase of an output signal to an input signal of the first longitudinally coupled resonator surface acoustic wave filter 11, and the phase of a signal flowing to the first sub-IDT portion 33a from the input end of the second longitudinally coupled resonator surface acoustic wave filter 32 are arranged to be the same phase, and similarly, the phase of an output signal to an input signal of the third longitudinally coupled resonator surface acoustic wave filter 13, and the phase of a signal flowing to the second sub-IDT portion 33b from the input end of the second longitudinally coupled resonator surface acoustic wave filter 32 are arranged to be the same phase.

Accordingly, as with the case of the first preferred embodiment, the present preferred embodiment also enables a surface acoustic wave filter device to be provided, which includes a balanced-to-unbalanced conversion function, enables the balanced signal terminals 6 and 7 sides, i.e., the impedance of the output side to be set two to four times as much as the impedance of the input end, enables the influence of the ripple of a bulk wave to be reduced without leading to increase in ohmic loss due to an IDT electrode, and enables an insertion loss to be reduced effectively.

Third Preferred Embodiment

Figure 7:
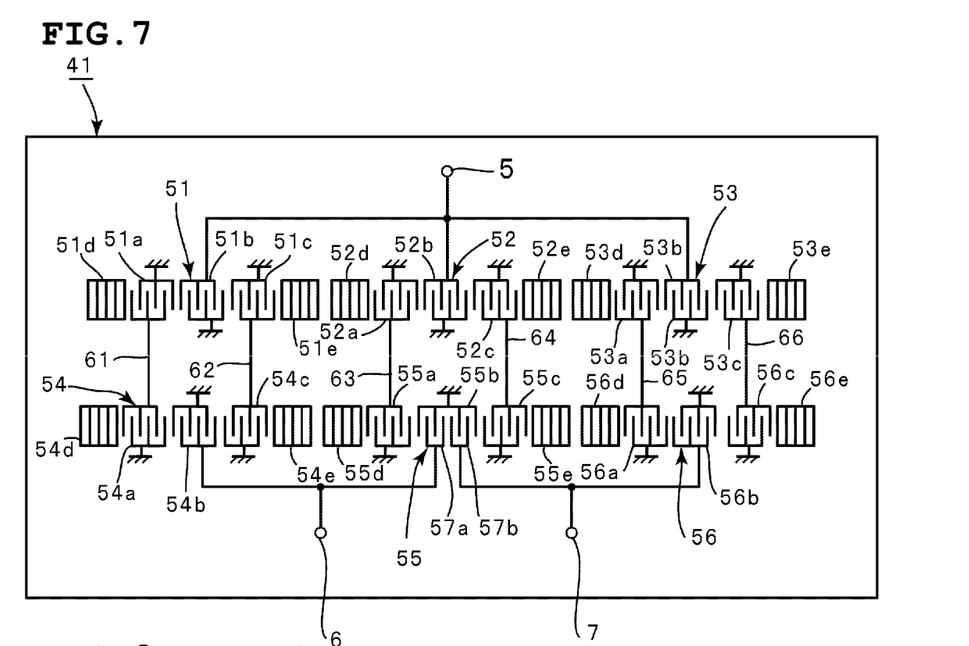
FIG. 7 is a schematic plan view illustrating a surface acoustic wave filter device according to a third preferred embodiment of the present invention.

FIG. 7 is a schematic plan view illustrating a surface acoustic wave filter device 41 according to a third preferred embodiment of the present invention.

With the surface acoustic wave filter device 41, first ends of second IDTs 51b to 53b of the centers of first to third longitudinally coupled resonator surface acoustic wave filters 51 to 53 defining 3-IDT type filters are connected to the unbalanced signal terminal 5. Second ends of the second IDTs 51b to 53b are connected to ground.

On the other hand, first and third IDTs 51a and 51c of the first longitudinally coupled resonator surface acoustic wave filter 51 are connected to a first end of first and third IDTs 54a and 54c of a fourth longitudinally coupled resonator surface acoustic wave filter 54 by first and second signal lines 61 and 62. The second end of the first and third IDTs 51a and 51c, and the second ends of the IDTs 54a and 54c are connected to ground.

Similarly, first ends of first and third IDTs 52a and 52c of the second longitudinally coupled resonator surface acoustic wave filter 52 are connected to a first end of first and third IDTs 55a and 55c of fifth longitudinally coupled resonator surface acoustic wave filter 55 by third and fourth signal lines 63 and 64. The second end of the IDTs 52a and 52c, and the second ends of the IDTs 55a and 55c are connected to ground.

Also, first ends of first and third IDTs 53a and 53c of the third longitudinally coupled resonator surface acoustic wave filter 53 are connected to a first end of first and third IDTs 56a and 56c of sixth longitudinally coupled resonator surface acoustic wave filter 56 by fifth and sixth signal lines 65 and 66. The second end of the IDTs 53a and 53c, and the second ends of the IDTs 56a and 56c are connected to ground.

Also, the first to sixth longitudinally coupled resonator surface acoustic wave filters 51 to 56 each have reflectors 51d, 51e to 56d, and 56e at both sides in the surface wave propagating direction of a region where the first to third IDTs are provided.

That is to say, with the present preferred embodiment, the first to third longitudinally coupled resonator surface acoustic wave filters 51 to 53 and the fourth to sixth longitudinally coupled resonator surface acoustic wave filters 54 to 56 are subjected to two-stage continuous connection.

Also, with the fifth longitudinally coupled resonator surface acoustic wave filter 55, as with the longitudinally coupled resonator surface acoustic wave filter 32 shown in FIG. 6, the second IDT 55b includes first and second sub-IDT portions 57a and 57b disposed in the surface wave propagating direction.

That is to say, with the fifth longitudinally coupled resonator surface acoustic wave filter 55, the first and second sub-IDT portions 57a and 57b are provided as first and second output terminals.

One end of the second IDT 54b of the fourth longitudinally coupled resonator surface acoustic wave filter 54, and the above-mentioned first sub-IDT portion 57a are commonly connected, and are connected to the first balanced signal terminal 6. On the other hand, the second IDT section 57b, and one end of the second IDT 56b of the center of the sixth longitudinally coupled resonator surface acoustic wave filter 56 are commonly connected, and are connected to the second balanced signal terminal 7.

The first end of the IDT 54b, the second end of the IDT 55b, and the second end of the IDT 56b are connected to ground.

With the present preferred embodiment, signals flowing the first, third, and fifth signal lines 61, 63, and 65 have the same phase, signals flowing the second, fourth, and sixth signal lines 62, 64, and 66 have the same phase, and the phase of the signals flowing the first, third, and fifth signal lines 61, 63, and 65 differs by about 180 degrees from the phase of the signals flowing the second, fourth, and sixth signal lines 62, 64, and 66. The direction of the IDT 54a and the direction of the IDT 54c are arranged to be inverted relative to the IDT 54b, and similarly, the direction of the IDT 56a and the direction of the IDT 56c are arranged to be inverted relative to the IDT 56b.

Accordingly, with the surface acoustic wave filter device 41 as well, balanced output can be taken out from the second balanced signal terminals 6 and 7, and also the output impedance can be increased two to four times as much as the input impedance. Further, as with the first and second preferred embodiments, the influence due to a bulk wave can be reduced without increasing ohmic loss due to an IDT electrode, and consequently, an insertion loss within a passband can be reduced.

Note that with the first to third preferred embodiments and the above-mentioned modifications, description has been made regarding the surface acoustic wave filter devices, but the present invention is not restricted to a device including a surface acoustic wave; rather, an elastic wave device including another elastic wave such as an elastic boundary wave may be used. That is to say, the same electrode configuration as those in the above-mentioned preferred embodiments may be formed at the interface between a piezoelectric substance and a dielectric substance, thereby configuring a surface acoustic wave filter device.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. An elastic wave filter device comprising:
   a piezoelectric substrate;
   first to third longitudinally coupled resonator elastic wave filters including:
      first to third IDTs disposed along an elastic wave propagating direction on said piezoelectric substrate; and
      reflectors disposed at both sides in the elastic wave propagating direction of a region where said first to third IDTs are provided;
   an unbalanced signal terminal to which each second IDT of said first to third longitudinally coupled resonator elastic wave filters is connected; and
   first and second balanced signal terminals defining output terminals; wherein
   a phase of an output signal to an input signal of said first longitudinally coupled resonator elastic wave filter differs by about 180 degrees from a phase of an output signal to an input signal of said third longitudinally coupled resonator elastic wave filter;
   said second longitudinally coupled resonator elastic wave filter includes first and second output terminals;
   a phase of a signal to be transmitted to said first output terminal from an input terminal of said second longitudinally coupled resonator elastic wave filter differs by about 180 degrees from a phase of a signal to be transmitted to said second output terminal from the input terminal of said second longitudinally coupled resonator elastic wave filter;
   a phase of the output signal corresponding to the input signal of said first longitudinally coupled resonator elastic wave filter is the same as a phase of the signal transmitted to said first output terminal from the input terminal of said second longitudinally coupled resonator elastic wave filter;
   a phase of the output signal corresponding to the input signal of said third longitudinally coupled resonator elastic wave filter is the same as a phase of the signal transmitted to said second output terminal from the input terminal of said second longitudinally coupled resonator elastic wave filter;
   one of the first and third IDTs of said second longitudinally coupled resonator elastic wave filter is connected to said first output terminal, and the other is connected to said second output terminal; and
   the first and third IDTs of said first longitudinally coupled resonator elastic wave filter, and said first output terminal of said second longitudinally coupled resonator elastic wave filter are connected to said first balanced signal terminal, and the first and third IDTs of said third longitudinally coupled resonator elastic wave filter, and said second output terminal of said second longitudinally coupled resonator elastic wave filter are connected to said second balanced signal terminal.

2. The elastic wave filter device according to claim 1, wherein at least said two longitudinally coupled resonator elastic wave filters are arranged such that the elastic wave propagating path of each filter is positioned substantially along the same straight line, and adjacent reflectors are shared with one reflector at least at one location of locations where longitudinally coupled resonator elastic wave filters are adjacent to each other in the elastic wave propagating direction.

3. A duplexer comprising:
   a transmission-side filter; and
   a reception-side filter including the elastic wave filter device according to claim 1.

4. An elastic wave filter device comprising:
   a piezoelectric substrate;
   first to third longitudinally coupled resonator elastic wave filters including:
      first to third IDTs disposed in order in an elastic wave propagating direction on said piezoelectric substrate; and
      reflectors disposed at both sides in the elastic wave propagating direction of a region where said first to third IDTs are provided;
   an unbalanced signal terminal to which the respective first and third IDTs of said first to third longitudinally coupled resonator elastic wave filters are connected; and
   first and second balanced signal terminals defining output terminals; wherein
   a phase of an output signal to an input signal of said first longitudinally coupled resonator elastic wave filter differs by about 180 degrees from a phase of an output signal to an input signal of said third longitudinally coupled resonator elastic wave filter;
   said second longitudinally coupled resonator elastic wave filter includes first and second output terminals;
   a phase of a signal to be transmitted to said first output terminal from an input end of said second longitudinally coupled resonator elastic wave filter differs by about 180 degrees from a phase of a signal to be transmitted to said second output terminal from the input end of said second longitudinally coupled resonator elastic wave filter;

a phase of the output signal corresponding to the input signal of said first longitudinally coupled resonator elastic wave filter is the same as a phase of the signal transmitted to said first output terminal from the input end of said second longitudinally coupled resonator elastic wave filter;

a phase of the output signal corresponding to the input signal of said third longitudinally coupled resonator elastic wave filter is the same as a phase of the signal transmitted to said second output terminal from the input end of said second longitudinally coupled resonator elastic wave filter;

the second IDT of said second longitudinally coupled resonator elastic wave filter includes a first sub-IDT portion and a second sub-IDT portion which are provided by being divided in the elastic wave propagating direction, and said first sub-IDT portion and said second sub-IDT portion is each connected to said first and second output terminals;

the second IDT of said first longitudinally coupled resonator elastic wave filter, and the first sub-IDT portion of said second longitudinally coupled resonator elastic wave filter are connected to said first balanced signal terminal; and the second IDT of said third longitudinally coupled resonator elastic wave filter, and the second sub-IDT portion of said second longitudinally coupled resonator elastic wave filter are connected to said second balanced signal terminal.

5. The elastic wave filter device according to claim 4, wherein at least said two longitudinally coupled resonator elastic wave filters are arranged such that the elastic wave propagating path of each filter is positioned substantially along the same straight line, and adjacent reflectors are shared with one reflector at least at one location of locations where longitudinally coupled resonator elastic wave filters are adjacent to each other in the elastic wave propagating direction.

6. A duplexer comprising:
   a transmission-side filter; and
   a reception-side filter including the elastic wave filter device according to claim 4.

7. An elastic wave filter device comprising:
   a piezoelectric substrate;
   first to sixth longitudinally coupled resonator elastic wave filters including:
      first to third IDTs disposed in order along an elastic wave propagating direction on said piezoelectric substrate; and
      reflectors disposed at both sides in the elastic wave propagating direction of a region where said first to third IDTs are provided;
   an unbalanced signal terminal to which each second IDT of said first to third longitudinally coupled resonator elastic wave filters is connected; and
   first and second balanced signal terminals defining output terminals; wherein the first and third IDTs of said first longitudinally coupled resonator elastic wave filter are connected to the first and third IDTs of said fourth longitudinally coupled resonator elastic wave filter by first and second signal lines, respectively;

the first and third IDTs of said second longitudinally coupled resonator elastic wave filter are connected to the first and third IDTs of said fifth longitudinally coupled resonator elastic wave filter by third and fourth signal lines, respectively;

the first and third IDTs of said third longitudinally coupled resonator elastic wave filter are connected to the first and third IDTs of said sixth longitudinally coupled resonator elastic wave filter by fifth and sixth signal lines, respectively;

signals which flow to said first, third, and fifth signal lines have the same phase, signals which flow to said second, fourth, and sixth signal lines have the same phase, the phase of the signals which flow to said first, third, and fifth signal lines differs by about 180 degrees from the phase of the signals which flow to said second, fourth, and sixth signal lines;

the second IDT of said fifth longitudinally coupled resonator elastic wave filter includes a first sub-IDT portion and a second sub-IDT portion which are provided by being divided in the elastic wave propagating direction;

the second IDT of said fourth longitudinally coupled resonator elastic wave filter, and the first sub-IDT portion of said fifth longitudinally coupled resonator elastic wave filter are connected to said first balanced signal terminal;

the second IDT of said sixth longitudinally coupled resonator elastic wave filter, and the second sub-IDT portion of said fifth longitudinally coupled resonator elastic wave filter are connected to said second balanced signal terminal;

the respective first to third IDTs of said first to sixth longitudinally coupled resonator elastic wave filters are configured such that balanced output can be taken out from said first and second balanced signal terminals.

8. The elastic wave filter device according to claim 7, wherein at least said two longitudinally coupled resonator elastic wave filters are arranged such that the elastic wave propagating path of each filter is positioned substantially along the same straight line, and adjacent reflectors are shared with one reflector at least at one location of locations where longitudinally coupled resonator elastic wave filters are adjacent to each other in the elastic wave propagating direction.

9. A duplexer comprising:
   a transmission-side filter; and
   a reception-side filter including the elastic wave filter device according to claim 7.

* * * * *